(12) United States Patent
Chen et al.

(10) Patent No.: US 11,728,303 B2
(45) Date of Patent: Aug. 15, 2023

(54) THREE-DIMENSIONAL NAND MEMORY DEVICE AND METHOD OF FORMING THE SAME

(71) Applicant: Yangtze Memory Technologies Co., Ltd., Hubei (CN)

(72) Inventors: He Chen, Wuhan (CN); Liang Xiao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 108 days.

(21) Appl. No.: 17/149,111

(22) Filed: Jan. 14, 2021

(65) Prior Publication Data
US 2022/0068857 A1    Mar. 3, 2022

Related U.S. Application Data

(63) Continuation of application No. PCT/CN2020/112032, filed on Aug. 28, 2020.

(51) Int. Cl.
*H01L 23/522*    (2006.01)
*H01L 25/065*    (2023.01)
(Continued)

(52) U.S. Cl.
CPC .......... *H01L 24/08* (2013.01); *H01L 23/5226* (2013.01); *H01L 24/80* (2013.01);
(Continued)

(58) Field of Classification Search
CPC ..... H01L 24/08; H01L 23/5226; H01L 24/80; H01L 25/0657; H01L 25/18; H01L 25/50;
(Continued)

(56) References Cited

U.S. PATENT DOCUMENTS 10,658,378 B2    5/2020    Tao et al.
10,714,497 B1    7/2020    Nishida. et al.
(Continued)

FOREIGN PATENT DOCUMENTS

CN    109075170 A    12/2018
CN    109326602 A    2/2019
(Continued)

OTHER PUBLICATIONS

Combined Chinese Office Action and Search Report dated Mar. 23, 2022 in Patent Application No. 202080002369.X (with English translation of Category of Cited Documents), 13 pages.
International Search Report dated May 26, 2021 in PCT/CN2020/112032 filed on Aug. 28, 2020, 4 pages.

*Primary Examiner* — Thanh Y. Tran
(74) *Attorney, Agent, or Firm* — Oblon, McClelland, Maier & Neustadt, L.L.P.

(57) ABSTRACT

A semiconductor device is provided. The semiconductor device includes a base layer having a first side for forming memory cells and a second side that is opposite to the first side. The semiconductor device includes a stack of alternating word line layers and insulating layers that is positioned over the first side of the base layer, where the stack includes a first region and a second region. A channel structure extends through the first region of the stack in a vertical direction and further extends into the base layer from the first side. A plurality of connection structures are formed over the second side of the base layer and include a first connection structure that is coupled to the channel structure.

13 Claims, 9 Drawing Sheets

(51) Int. Cl.
*H01L 23/00* (2006.01)
*H01L 25/18* (2023.01)
*H01L 25/00* (2006.01)
*H10B 41/27* (2023.01)
*H10B 43/27* (2023.01)

(52) U.S. Cl.
CPC .......... *H01L 25/0657* (2013.01); *H01L 25/18* (2013.01); *H01L 25/50* (2013.01); *H10B 41/27* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ......... H01L 27/11556; H01L 27/11582; H01L 2924/1431; H01L 27/11524; H01L 27/11529; H01L 27/1157
See application file for complete search history.

(56) References Cited

U.S. PATENT DOCUMENTS

| | | |
|---|---|---|
| 10,937,806 B2 | 3/2021 | Tao et al. |
| 2015/0179660 A1 | 6/2015 | Yada et al. |
| 2019/0341399 A1* | 11/2019 | Tao .................... H01L 27/1157 |
| 2020/0058669 A1 | 2/2020 | Chen et al. |
| 2020/0258376 A1 | 8/2020 | Hosoda et al. |
| 2020/0258904 A1 | 8/2020 | Kai et al. |
| 2021/0320094 A1* | 10/2021 | Zhang .................... H01L 25/18 |

FOREIGN PATENT DOCUMENTS

| | | |
|---|---|---|
| CN | 110506334 A | 11/2019 |
| CN | 111316442 A | 6/2020 |
| CN | 111370423 A | 7/2020 |
| CN | 111566815 A | 8/2020 |
| TW | 201834207 A | 9/2018 |
| WO | WO 2020/031265 A1 | 2/2020 |

* cited by examiner

THREE-DIMENSIONAL NAND MEMORY DEVICE AND METHOD OF FORMING THE SAME

RELATED APPLICATION

This application is a bypass continuation of International Application No. PCT/CN2020/112032, filed on Aug. 28, 2020. The entire disclosure of the prior application is hereby incorporated by reference in its entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in microcomputers, automatic control systems, and the like. To increase the bit density and reduce the bit cost of the flash memory devices, three-dimensional (3D) NAND (Not AND) flash memory devices have been developed.

In a related 3D NAND architecture, periphery circuits take up about 20-30% of die area, which lowers NAND bit density. As 3D NAND technology continues to progress to 128 layers and above, the periphery circuits can likely take up more than 50% of the total die area. In a cross-stacking structure, the periphery circuits which handle data I/O as well as memory cell operations are processed on a separate wafer (CMOS wafer) using a logic technology node (e.g., 14 nm, 7 nm) that enables the desired I/O speed and functions. Once the processing of a cell array wafer is completed, the two wafers are connected electrically through millions of metal vertical interconnect accesses (VIAs) that are formed simultaneously across the whole wafer in one process step. By using the innovative cross-stacking structure, the periphery circuits are now above cell array chip formed in the cell array wafer, which enables much higher NAND bit density than related 3D NAND with limited increase in total cost.

SUMMARY

The inventive concepts relate to formation of a 3D NAND memory device with a cross-stacking structure and a method of reducing parasitic capacitance in the cross-stacking structure.

In related 3D-NAND memory devices that are formed based on the cross-stacking structure, a plurality of transistors are formed over a top surface of a CMOS substrate (or periphery circuit substrate), and a memory cell stack that includes memory cells is formed over a top surface of a cell array substrate. The CMOS substrate is bonded through bonding VIAs with the cell array substrate. Here, the top surface of the CMOS substrate and the top surface of the cell array substrate are aligned facing each other so that the transistors and the memory cells are coupled to each other. Further, a plurality of through silicon vias (TSVs) are formed and connection structures (e.g., bottom top metal) are formed over the TSVs. The TSVs extend through the cell array substrate so as to be coupled to the memory cells in the memory cell stack. Accordingly, input/output signals can be transmitted through the TSVs between external control circuits and the memory cells.

Further, in the related 3D-NAND memory devices strong parasitic capacitance can be produced between the connection structures and the cell array substrate, and between the TSVs and the cell array substrate when the related 3D-NAND memory devices are operated, which can slow down the operation and storage speed of the related 3D-NAND memory devices. In the present disclosure, the memory cell stack can be formed in a polysilicon layer instead of the cell array substrate, the TSVs can be eliminated, and the connection structures can be coupled to the memory cells directly. Thus, the parasitic capacitance observed between the connection structures (e.g., bottom top metal) and the cell array substrate, and between the TSVs and the cell array substrate in the related 3D-NAND memory devices can be eliminated.

According to an aspect of the disclosure, a semiconductor device is provided. The semiconductor device can include a base layer having a first side for forming memory cells and a second side that is opposite to the first side. The semiconductor device can include a stack of alternating word line layers and insulating layers positioned over the first side of the base layer, where the stack includes a first region and a second region. A channel structure can extend through the first region of the stack in a vertical direction and further extend into the base layer from the first side. A plurality of connection structures can be formed over the second side of the base layer and include a first connection structure that is coupled to the channel structure.

The semiconductor device can also include a doped region that is formed in the second side of the base layer and coupled to the channel structure. A first dielectric layer can be formed over the second side of the base layer. Accordingly, the connection structures can extend through the first dielectric layer so that the first connection structure of the connection structures is in direct contact with the doped region.

Additionally, the semiconductor device can include a second dielectric layer arranged in the base layer between the first side and the second side. The semiconductor device can also include a third dielectric layer formed over a first surface of the second dielectric layer and the first side of the base layer, where the stack can be arranged in the third dielectric layer. A plurality of bonding pad contacts can be formed in the second dielectric layer and the third dielectric layer, where the bonding pad contacts can extend in the vertical direction between a second surface of the second dielectric layer and a top surface of the third dielectric layer.

In some embodiments, the connection structures can include a second connection structure that is positioned over the second surface of the second dielectric layer and coupled to the bonding pad contacts.

In other embodiments, the second region of the stack can have a stair-cased configuration and the semiconductor device can further include a plurality of word line contacts that extend from respective word line layers in the second region through the third dielectric layer in the vertical direction.

The connection structures can also include a third connection structure and the semiconductor device can further include a gate line slit structure. The gate line slit structure can extend through the third dielectric layer in the vertical direction and extend into the base layer, and further be coupled to the third connection structure.

The semiconductor device can include a source layer that is positioned between the base layer and the stack, and surrounds a bottom channel contact of the channel structure.

Further, the semiconductor device can include a substrate having a first side and an opposing second side. A transistor can be formed in the first side of the substrate. A plurality of contact structures can extend from the first side of the substrate in the vertical direction, and one of the contact structures can be coupled to the transistor.

In some embodiments, first bonding structures can be formed over the top surface of the third dielectric layer and coupled to the bonding pad contacts, the word line contacts, and a top channel contact of the channel structure. In addition, second bonding structures can be formed over the contact structures and coupled to the contact structures. The first side of the substrate and the first side of the base layer can be aligned facing each other so that the first bonding structures and the second bonding structures are connected to each other.

According to another aspect of the disclosure, a method for manufacturing a semiconductor device is provided. In the method, a base layer can be formed over an array substrate, where the base layer can have a first side and an opposing second side that is in contact with the array substrate. A memory cell structure can be formed over the first side of the base layer. The memory cell structure can include a stack of alternating word line layers and insulating layers that is positioned over the first side of the base layer. The memory cell structure can include a channel structure that extends through a first region of the stack in a vertical direction and further extends into the base layer from the first side. The array substrate can be subsequently removed so that the second side of the base layer is uncovered. A plurality of connection structures can be formed over the second side of the base layer, where the connection structures can include a first connection structure that is coupled to the channel structure.

In some embodiments, a second dielectric layer can be formed, where the second dielectric layer can be arranged in the base layer between the first side and the second side.

In order to form the memory cell structure, a third dielectric layer can be formed over a first surface of the second dielectric layer and the first side of the base layer, where the stack and the channel structure are arranged in the third dielectric layer. A plurality of bonding pad contacts can be formed in the second dielectric layer and the third dielectric layer, where the bonding pad contacts can extend in the vertical direction between a second surface of the second dielectric layer and a top surface of the third dielectric layer. A plurality of word line contacts can be formed to extend from respective word line layers in a second region of the stack through the third dielectric layer in the vertical direction, where the second region of the stack can have a stair-cased configuration. A gate line slit structure can be formed to extend through the third dielectric layer in the vertical direction and further extend into the base layer. In some embodiments, the connection structures can include a third connection structure that is coupled to the gate line slit structure. A source layer can further be formed that is positioned between the base layer and the stack, and surrounds a bottom channel contact of the channel structure.

In the method, first bonding structures can be formed over the top surface of the third dielectric layer and coupled to the bonding pad contacts, the word line contacts, and a top channel contact of the channel structure.

In the method, a dielectric stack can further be formed over the second side of the base layer after the array substrate is removed, and a bonding pad can be formed over the dielectric stack.

Further, a transistor can be formed in a first side of a periphery substrate. A plurality of contact structures can be formed to extend from the first side of the periphery substrate in the vertical direction, where one of the contact structures can be coupled to the transistor. In addition, second bonding structures can be formed over the contact structures and coupled to the contact structures. The base layer and the periphery substrate can be subsequently bonded together, where the first side of the periphery substrate and the first side of the base layer can be aligned facing each other so that the first bonding structures and the second bonding structures are connected to each other.

The dielectric stack and the bonding pad can subsequently be removed. A doped region can be formed in the second side of the base layer, where the dope region can be coupled to the channel structure. A first dielectric layer can be formed over the second side of the base layer. Thus, the connection structures can be formed over and further extend through the first dielectric layer so that the first connection structure of the connection structures is in direct contact with the doped region.

According to yet another aspect of the disclosure, a semiconductor device is provided. The semiconductor device can include a transistor formed in a first side of a substrate, a memory cell structure formed over a first side of a base layer, and a plurality of connection structures formed over an opposing second side of the base layer. The memory cell structure can include a stack of alternating word line layers and insulating layers that is positioned over the first side of the base layer, where the stack can include a first region and a second region. The memory cell structure can include a channel structure that extends through the first region of the stack in a vertical direction and further extends into the base layer from the first side. The memory cell structure can also include a plurality of word line contacts extending from respective word line layers in the second region of the stack, where the second region of the stack can have a stair-cased configuration. In the semiconductor device, the connection structures can include a first connection structure that is coupled to the channel structure, and the first side of the substrate and the first side of the base layer can be aligned facing each other so that the transistor and the channel structure are coupled to each other.

In addition, the semiconductor device can include a doped region that is positioned in the second side of the base layer and coupled to the channel structure, and a first dielectric layer that is formed over the second side of the base layer. The connection structures can extend through the first dielectric layer so that the first connection structure of the connection structures is in direct contact with the doped region.

The semiconductor device can include a second dielectric layer that is arranged in the base layer between the first side and the second side, and a third dielectric layer that is formed over a first surface of the second dielectric layer and the first side of the base layer. The stack can be arranged in the third dielectric layer. The semiconductor device can further include a plurality of bonding pad contacts that are formed in the second dielectric layer and the third dielectric layer. The bonding pad contacts can extend in the vertical direction between a second surface of the second dielectric layer and a top surface of the third dielectric layer.

In the semiconductor device, a plurality of contact structures can be formed to extend from the first side of the substrate in the vertical direction. A first contact structure of the contact structures can be coupled to the transistor and further coupled to one of the word line contacts, and a second contact structure of the contact structures can be couple to one of the bonding pad contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the disclosure, a 3D-NAND memory device can be formed based on a cross-stacking structure. The 3D-NAND memory device can include a plurality of transistors and a memory cell stack. The transistors can be formed over a top surface of a CMOS substrate (or periphery circuit substrate), and the memory cell stack that includes memory cells can be formed over a top surface of a polysilicon layer. The CMOS substrate can further be bonded through bonding structures with the polysilicon layer so that the transistors and the memory cells are coupled to each other. The memory cell stack can include staircase regions and array regions that are formed in a stack of word line layers and insulating layers. The word line layers and the insulating layers can be disposed alternatingly over a top surface of the polysilicon layer. The word line layers can include bottom select gate (BSG) layers, gate layers (or word line layers), and top select gate (TSG) layers that are disposed sequentially over the polysilicon layer. The array regions can include a plurality of channel structures that extend through the stack of word line layers and insulating layers and further extend into the polysilicon layer. Each of the channel structures can be coupled to the word line layers to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the polysilicon layer along a vertical direction. The BSTs can be formed of the channel structure and the BSG layers, the MCs can be formed of the channel structure and the word line layers, and the TSTs can be formed of the channel structure and the TSG layers.

In the 3D-NAND device, the staircase regions can include stairs that are formed in the BSG layers, the word line layers, and the TSG layers. Word line contacts can further be formed on the stairs to connect to the BSG layers, the word line layers, and the TSG layers.

Further, the channel structure can be formed through a channel hole with multiple layers of material concentrically arranged, for example, circularly about a central axis. The channel hole can be a concentric circle, and the multiple layers can include a barrier layer (e.g., SiO layer), a charge trapping layer (e.g., SiN layer), a tunneling layer (e.g., SiO layer), and a channel layer (e.g., a poly Si layer) that are sequentially filled in the concentric circle. In addition, the concentric circle can be filled with an insolation layer (e.g., SiO layer) so as to form a continuous charge capture memory structure from a top to a bottom of the channel structure.

Comparing to related 3D-NAND memory devices, where a memory cell stack is formed in an array cell substrate, the memory cell stack in the 3D-NAND device is formed in the polysilicon layer. In the related 3D-NAND devices, a plurality of TSVs are required to extend through the array cell substrate so that connection structures (e.g., bottom top metal) are able to connect to the memory cell stack through TSVs. While in the 3D-NAND memory device, the connection structures are formed over the polysilicon layer and coupled to the memory cell stack directly, and the TSVs can be accordingly eliminated. Thus, parasitic capacitance produced between the connection structures (e.g., bottom top metal) and the cell array substrate, and between the TSVs and the cell array substrate in the related 3D-NAND memory devices can be eliminated.

Figure 1:
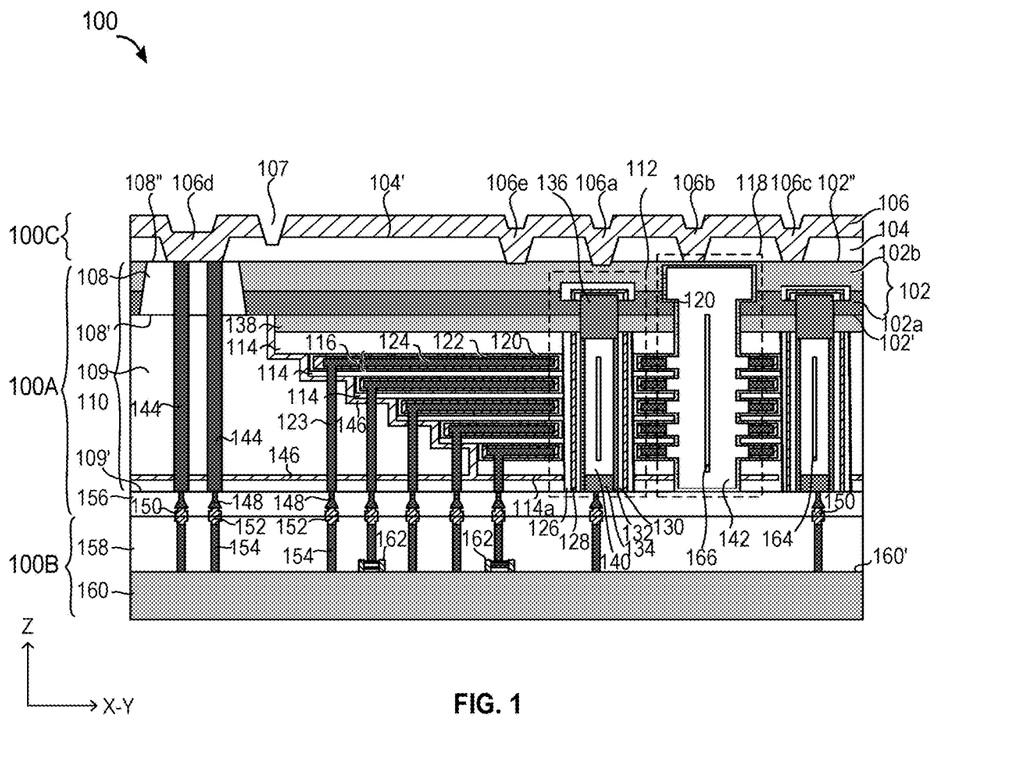
FIG. 1 is cross-sectional view of an exemplary 3D-NAND device, in accordance with exemplary embodiments of the disclosure.

FIG. 1 is a cross-sectional view of an exemplary 3D-NAND memory device 100 (also referred to as device 100 or 3D-NAND device 100) that is formed based on a cross-stacking structure. As shown in FIG. 1, the 3D-NAND memory device 100 can include a memory cell structure (or array structure) 100A, a transistor structure (or periphery structure) 100B, and a connection structure (100C) that are coupled to each other. The memory cell structure 100A can include a memory cell stack 110 that is formed over a first side 102' of a base layer 102. The base layer 102 can include polysilicon, single crystal silicon, or other semiconductors such as germanium (Ge), silicon carbide (SiC), silicon germanium (SiGe), or diamond. Alternately, the base layer 102 may include a compound semiconductor and/or an alloy semiconductor. By way of example, in some embodiments, the base layer 102 may also include silicon phosphide (SiP), silicon phosphorus carbide (SiPC), a silicon-on-insulator (SOI) structure, a SiGe-on-SOI structure, a Ge-on-SOI structure, a III-VI materials, or a combination of any of the above materials.

In some embodiments, the base layer 102 can further include one or more layers. In an exemplary embodiment of FIG. 1, the base layer 102 includes a first polysilicon layer 102a and a second polysilicon layer 102b. The memory cell stack 110 can include a stack of alternating word line layers 116 and insulating layers 114 that is positioned over the first side 102' of the base layer 102, where the stack can include a first region (or array region) 110a and a second region (or staircase region) 110b that can be illustrated in FIG. 2. As shown in FIG. 1, each of the word lines layers 116 can include a conductive layer 124, a transition layer (or glue layer) 122 that surrounds the conductive layer 124, and a high-K layer 120 that surrounds the transition layer 122. In an exemplary embodiment of FIG. 1, the conductive layer 124 can be made of tungsten or cobalt, or other conductive materials, the transition layer 122 can be made of TiN, TaN, Ta, or other suitable transition materials, and the high-K layer 120 can be made of aluminum oxide ($Al_2O_3$), Hafnium oxide ($HfO_2$), Tantalum oxide ($Ta_2O_5$), or another material of high K (Dielectric Constant).

Still referring to FIG. 1, the memory cell stack 110 can include a plurality of channel structures 112 that can have a cylinder shape extending in a vertical direction (or Z-direction). In an exemplary embodiment of FIG. 1, two channel structures 112 are included. The channel structure 112 can extend through the first region 110a of the stack in the vertical direction and further extend into the base layer 102 from the first side 102'. Each of the channel structures 112 can be coupled to the word line layers 116 of the stack to form a respective vertical NAND memory cell string.

Further, each of the channel structures 112 can include a barrier layer 126, a charge trapping layer 128, a tunneling layer 130 and a channel layer 132. The barrier layer 126 can extend into the base layer 102 in the vertical direction and in direct contact with the word line layers 116 and the insulating layers 114. The charge trapping layer 128 can extend into the base layer 102, and be formed along an inner surface of the barrier layer 126 and positioned over the barrier layer 126. The tunneling layer 130 can extend into the base layer 102, and be formed along an inner surface of the charge trapping layer 128 and positioned over the charge trapping layer 128. The channel layer 132 can be formed along an inner surface of the tunneling layer 130. Each of the channel structures 112 can also include an isolation layer 140, a bottom channel contact 136 and a top channel contact 134. The bottom channel contact 136 can extend into the base layer 102, and be formed along an inner surface of the tunneling layer 130 and positioned over the tunneling layer 130, where the channel layer 132 can further be disposed over the bottom channel contact 136. The isolation layer 140 can be form along an inner surface of the channel layer 132 and positioned over the bottom channel contact 136. The top channel contact 134 can be formed along the inner surface of the channel layer 132 and also arranged over the isolation layer 140. Further, a source layer 138 can be formed between the base layer 102 and the insulating layer 114 of the stack. As shown in FIG. 1, portions of the barrier layer 126, the charge trapping layer 128, and the tunneling layer 130 between the base layer 102 and the insulating layer 114 can be removed, and the source layer 138 can be formed to surround the bottom channel contact 136. In some embodiments, a gap 164 can also be formed in the isolation layer 140 during the formation of the isolation layer 140.

In an embodiment of FIG. 1, the barrier layer 126 is made of $SiO_2$. In another embodiment, the barrier layer 126 can include multiple layers, such as $SiO_2$ and $Al_2O_3$. In an embodiment of FIG. 1, the charge trapping layer 128 is made of SiN. In another embodiment, the charge trapping layer 128 can include a multi-layer configuration, such as a SiN/SiON/SiN multi-layer configuration. In some embodiments, the tunneling layer 130 can include a multi-layer configuration, such as a SiO/SiON/SiO multi-layer configuration. In an embodiment of FIG. 1, the channel layer 132 is made of polysilicon via a furnace low pressure chemical vapor deposition (CVD) process. The isolation layer 140 can be made of $SiO_2$. The top and bottom channel contacts 134 and 136, and the source layer 138 can be made of polysilicon.

The memory cell stack 110 can have a plurality of slit structures (or gate line slit structures). For example, one slit structure 118 is included in FIG. 1. In some embodiments, a gate-last fabrication technology is used to form the device 100, thus the slit structures are formed to assist in the removal of the sacrificial word line layers, and the formation of the real gates. In some embodiments, the slit structures can be made of conductive materials and positioned on doped regions (not shown) that are formed in a second side 102" of the base layer 102 to serve as contacts, where the doped regions are configured to serve as common sources of the memory cell stack 110. In some embodiments, the slit structures can be made of dielectric materials to serve as separation structures. In an exemplary embodiment of FIG. 1, the slit structure 118 can be made of a dielectric layer 142. The slit structure 118 can extend into the base layer 102 through the word line layers 116 and the insulating layers 114, and be arranged along the inner surface of the high-K layer 120. In some embodiments, a gap 166 can be formed in the slit structure 118 during the formation of the dielectric layer 142.

Still referring to FIG. 1, the memory cell stack 110 can further include a second dielectric layer 108 and a third dielectric layer 109. The second dielectric layer 108 can be arranged in the base layer 102. In some embodiments, a first surface 108' of the second dielectric layer 108 can be level with the first side 102' of the base layer 102, and a second surface 108" of the second dielectric layer 108 can be level with the second side 102" of the base layer 102. The third dielectric layer 109 can be formed over the first surface 108' of the second dielectric layer 108 and the first side 102' of the base layer 102. The third dielectric layer 109 can be formed to cover the stack of alternating word line layers 116 and insulating layers 114. In some embodiments, an etch stop layer 146 can further be arranged in the third dielectric layer 109. The etch stop layer 146 can be formed along stairs in the staircase region 110b to cover the word line layers 116 and the insulating layers 114, and further extend along a top surface 114a of the stack of alternating word line layers and insulating layers.

The memory cell stack 110 can have a plurality of word line contacts 123. The word line contacts 123 are formed in the third dielectric layer 109 and positioned on respective word line layers 116 in the staircase region 110b to connect to the word line layers 116. For simplicity and clarity, five word line contacts 123 are illustrated in FIG. 1. The word line contacts 123 can include W, Co, or other suitable conductive materials. In some embodiments, transition layers (not shown) can be formed between the word line contacts 123 and the third dielectric layer 109.

The memory cell stack 110 can include a plurality of bonding pad contacts 144 formed in the second dielectric layer 108 and the third dielectric layer 109. The bonding pad contacts 144 can extend in the vertical direction between the second surface 108" of the second dielectric layer 108 and a top surface 109' of the third dielectric layer 109. The bonding pad contacts 144 can be configured to function as input/output pins (I/O pins). That is, the bonding pad contacts 144 can be used for data input and output to and from, respectively, the memory cells in the memory cell stack 110.

As shown in FIG. 1, the memory cell structure (or array structure) 100A can include a plurality of first bonding structures 150 and a plurality of first vias 148 that are positioned over the top surface 109' of the third dielectric layer 109 and arranged in a first dielectric stack 156. The first vias 148 can be formed over and coupled to the bonding pad contacts 144, the word line contacts 123, and top channel contacts 134 of the channel structures 112. The first bonding structures 150 can be formed over and coupled to the first vias 148.

Still referring to FIG. 1, the connection structure 100C can include a first dielectric layer 104 that is positioned over the second side 102" of the base layer 102, and a plurality of connection structures 106 formed over the second side 102" of the base layer 102. As shown in FIG. 1, the connection structures 106 can extend through the first dielectric layer 104 to connect to the bonding pad contacts 144 and the base layer 102 directly. For example. The connection structures 106d can be coupled to the bonding pad contacts 144. In some embodiments, doped regions (not shown), such as N-type wells, can be formed in the second side 102" of the base layer 102 to function as common source regions. Accordingly, the connection structures 106 can be coupled to the channel structures 112 and the slit structure 118 through the dope regions. For example, the connection structure 106a can be coupled to the channel structure 112, and the connection structure 106b can be coupled to the slit structure 118 respectively through the doped regions, where the channel structure 112 and the slit structure 118 can extend into the doped regions that are positioned in the base layer 102. In some embodiments, the connection structure 106 can be made of aluminum, copper, tungsten, or other suitable conductive materials.

The transistor structure (or periphery structure) 100B can include a periphery substrate (or CMOS substrate) 160, and a plurality of transistors 162 that are formed in a first side 160' of the periphery substrate 160. The transistor structure 100B can also include an inter-layer dielectric (ILD) 158, where a plurality of contact structures 154 can be formed in the ILD 158. The contact structures 154 can extend from the first side 160' of the periphery substrate 160 in the vertical direction, and a portion of the contact structures 154 can be coupled to the transistors 162. For example, the portion of the contact structures 154 can be coupled to source regions, gates, or drain regions of the transistors 162. In the transistor structure 100B, a plurality of second bonding structures 152 can be formed over the contact structures 154 and coupled to the contact structures 154.

The device 100 can be formed based on the cross-stacking structure, where the first side 160' of the periphery substrate 160 and the first side 102' of the base layer 102 are aligned facing each other, and the first bonding structures 150 and the second bonding structures 152 are connected to each other through a bonding process. Accordingly, as shown in FIG. 1, the memory cell structure (or array structure) 100A, the transistor structure (or periphery structure) 100B, and the connection structure 100C are coupled to each other when the first bonding structures 150 and the second bonding structures 152 are bonded together. For example, the transistors 162 can be coupled to the memory cell stack 110 through a connection channel that is formed based on the contact structures 154, the second bonding structures 152, the first bonding structures 150, the first vias 148, and the word line contacts 123. Thus, the transistors 162 can operate the memory cell stack 110 for writing, reading or erasing the memory cells in the memory cell stack 110. In another example, the bonding pad contacts 144 can be coupled to the contact structures 154 in the periphery substrate 160 through the second bonding structures 152, the first bonding structures 150, and the first vias 148.

In the related 3D-NAND memory devices (ore related devices), the memory cell stack is formed in a cell array substrate, and the transistor structure is formed in a periphery substrate. Thus, TSVs are required in the related devices in order to form connection channels. For example, the bonding pad contacts are TSVs that extend through the cell array substrate to connect to the contact structures in the periphery substrate. The connection structures are also TSVs that extend through the array cell substrate so as to connect to the channel structures and/or the slit structures. Accordingly, parasitic capacitance can be produced between the connection structures and the cell array substrate, and between the bonding pad contacts and the cell array substrate in the related devices. In the device 100, the memory cell stack is formed in a base layer rather than in the cell array substrate. In addition, the bonding pad contacts can be formed in a dielectric layers (e.g., the second dielectric layer) that is arranged in the base layer. Further, the connection structures can be formed over the base layer and extend through a dielectric layer (e.g., the first dielectric layer) to connect to the channel structures or the slit structures. Thus, TSVs are eliminated in the device 100, and parasitic capacitance can be reduced or eliminated accordingly.

Figure 2:
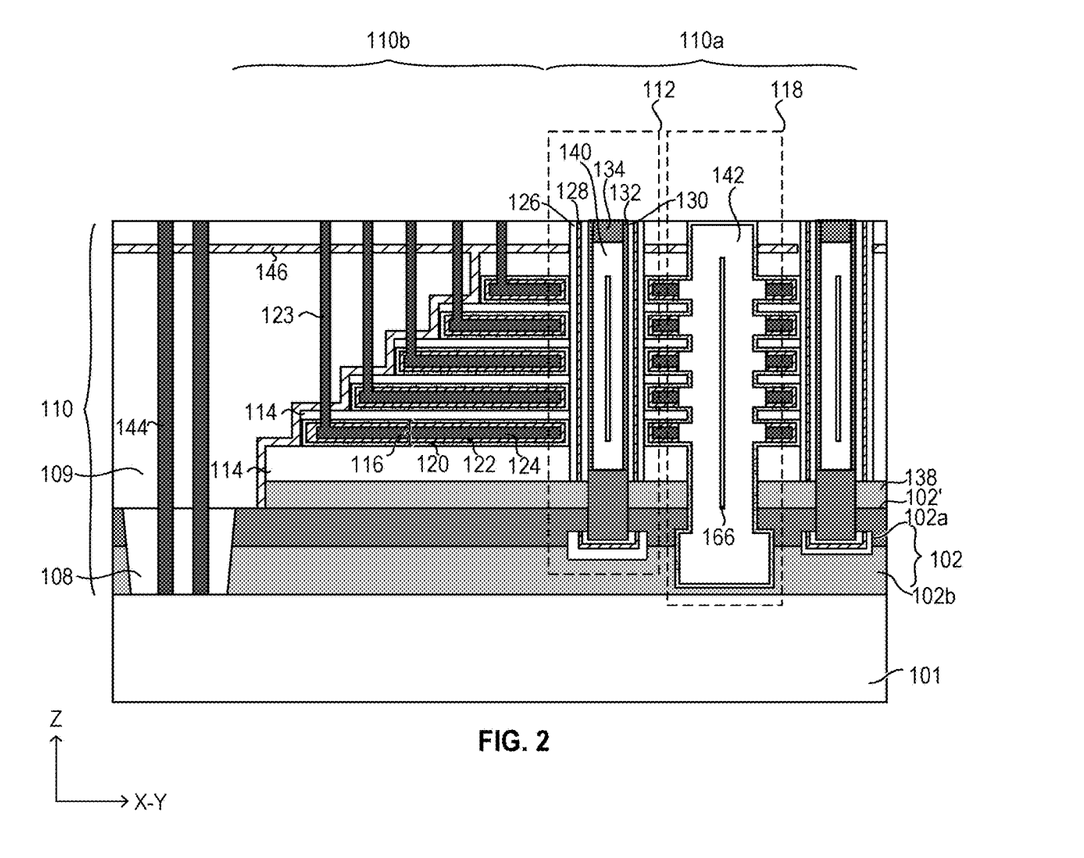
FIGS. 2, 3A, 3B, 4, 5, 6, 7 and 8 are top-down and cross-sectional views of various intermediate steps of manufacturing a 3D-NAND device, in accordance with exemplary embodiments of the disclosure.

FIGS. 2, 3A, 3B, 4, 5, 6, 7 and 8 are top-down and cross-sectional views of various intermediate steps of manufacturing a 3D-NAND device. As shown in FIG. 2, a base layer 102 can be formed over a cell array substrate 101, and a memory cell stack 110 can be formed over the base layer 102. The cell array substrate 101 can be a semiconductor substrate such as Si substrate. The cell array substrate 101 can also include other semiconductors such as germanium (Ge), silicon carbide (SiC), silicon germanium (SiGe), or diamond. The memory cell stack 110 can have similar configurations to the memory cell stack 110 illustrated in FIG. 1. For example, the memory cell stack 110 can include a stack of alternating word line layers 116 and insulating layers 114 that are disposed over a first side 102' of the base layer 102. The stack can include a first region (or array region) 110a and a second region (or staircase region) 110b. A plurality of channel structures 112 and one or more slit structures 118 can extend through the word line layers 116 and insulating layers 114 in the first region 110a in a vertical direction (Z-direction), and further extend into the base layer 102. The memory cell stack 110 can include a plurality of bonding pad contacts 144 that are formed in a second dielectric layer 108 and a third dielectric layer 109, where the second dielectric layer 108 is arranged in the base layer 102 and positioned over the cell array substrate 101, and the third dielectric layer 109 is positioned over the second dielectric layer 108 and the base layer 102.

The base layer 102 can include polysilicon, single crystal silicon, or other semiconductors such as germanium (Ge), silicon carbide (SiC), silicon germanium (SiGe), or diamond. Alternately, the base layer 102 may include a compound semiconductor and/or an alloy semiconductor. By way of example, in some embodiments, the base layer 102 may also include silicon phosphide (SiP), silicon phosphorus carbide (SiPC), a silicon-on-insulator (SOI) structure, a SiGe-on-SOI structure, a Ge-on-SOI structure, a III-VI materials, or a combination of any of the above materials. In an exemplary embodiment of FIG. 2, the base layer 102 can be made of polysilicon, and include one or more polysilicon layers, such as a first polysilicon layer 102a and a second polysilicon layer 102b. Any suitable deposition process can be applied to form the base layer 102, such as a chemical vapor deposition process, a physical vapor deposition process, a diffusion process, an atomic layer deposition process, or other suitable deposition processes.

Figure 3A:
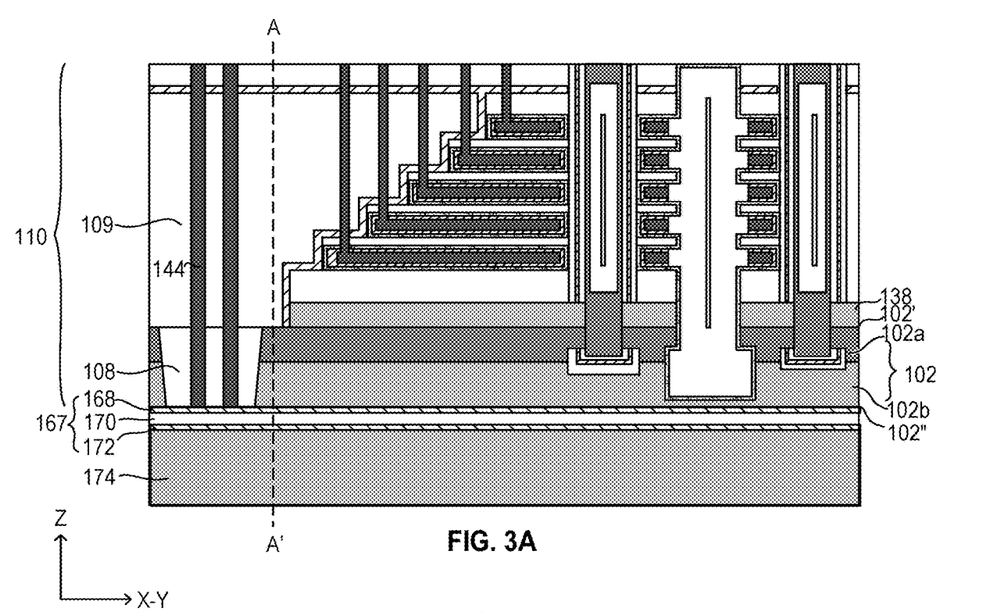
Figure 3B:
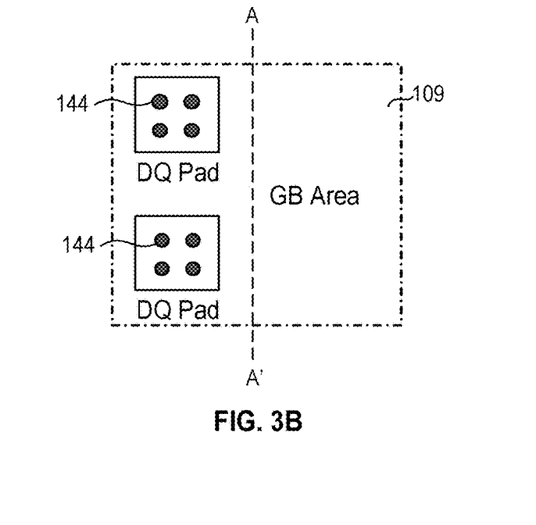

In FIGS. 3A and 3B, the cell array substrate 101 can be removed and a dielectric stack 167 can be formed over a second side 102" of the base layer 102 after the cell array substrate 101 is removed. FIG. 3A is a cross-section view and FIG. 3B is a top-down view. In addition, a contact pad (or bonding pad) 174 can be formed over the dielectric stack 167. The dielectric stack 167 can include one or more dielectric layers. In an exemplary embodiment of FIG. 3A, the dielectric stack 167 can include a top layer 168, a middle layer 170, and a bottom layer 172. In some embodiments, the top layer 168 and the bottom layer 172 can be made of SiO, and the middle layer 170 can be made of SiN. The contact pad 174 can be made of a conductive material, such as Al, W, or other suitable conductive materials. The dielectric stack 167 can function as a barrier layer between the base layer 102 and the contact pad 174. As shown in FIG. 3B, the memory cell stack 110 can include a first region, and a second region along a boundary line A-A'. The first region can include a plurality of DQ pads that is formed of the bonding pad contacts 144, and a second region (or giant block) can include the channel structures and the slit structures that are positioned in the stack of word line layers and insulating layers.

Figure 4:
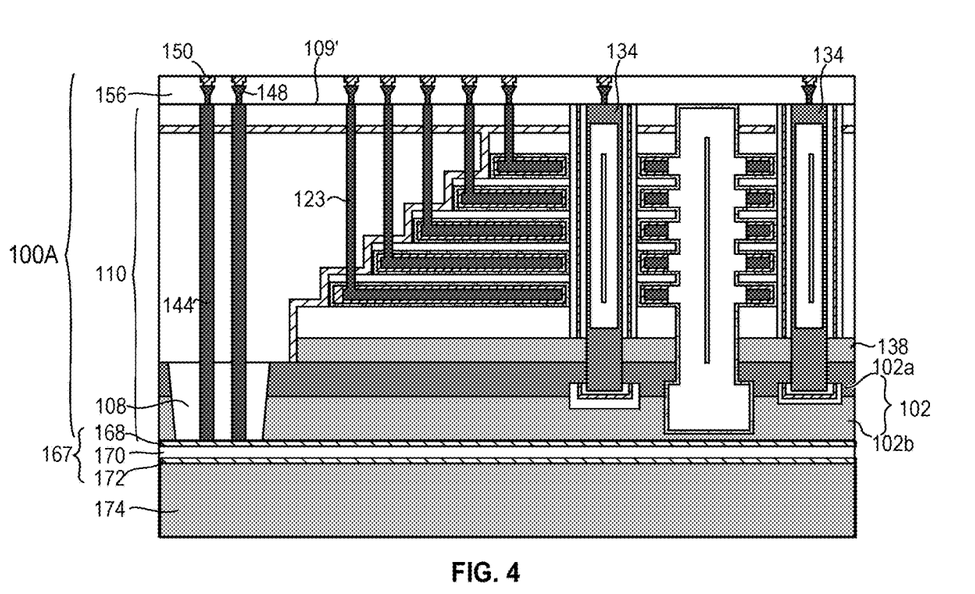

Further, as shown in FIG. 4, a plurality of first vias 148 and a plurality of first bonding structures 150 can be formed over the third dielectric layer 109. The first vias 148 and the first bonding structures 150 can be arrange in a first dielectric stack 156 that is disposed over a top surface 109' of the third dielectric layer 109. The first vias 148 can be coupled to the bonding pad contacts 114, the word line contacts 123, and top channel contacts 134. The first connection structures 150 can further be positioned over the first vias 148 and coupled to the first vias 148.

Figure 5:
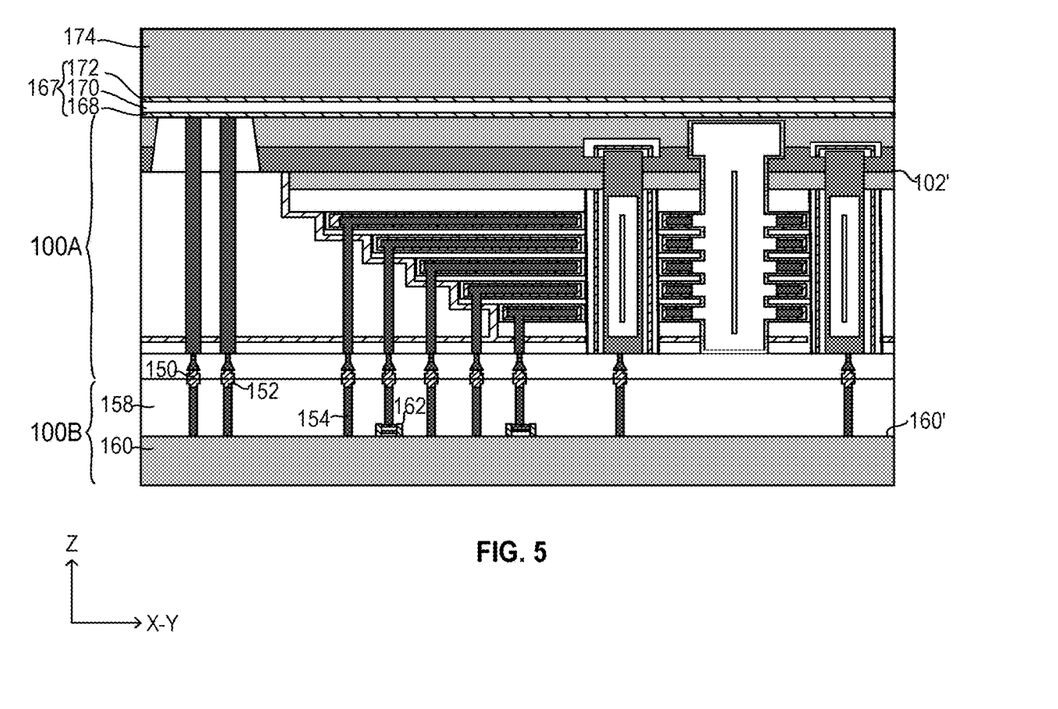

In FIG. 5, a transistor structure (or periphery structure) 100B can be formed at first. The transistor structure 100B can include a periphery substrate (or CMOS substrate) 160, and a plurality of transistors 162 that are formed in a first side 160' of the periphery substrate 160. The transistor structure 100B can also include an inter-layer dielectric (ILD) 158, where a plurality of contact structures 154 can be formed in the ILD 158. The contact structures 154 can extend from the first side 160' of the periphery substrate 160 in the vertical direction, and a portion of the contact structures 154 can be coupled to the transistors 162. In the transistor structure 100B, a plurality of second bonding structures 152 can be formed over the contact structures 154 and coupled to the contact structures 154.

Further, a bonding process can be performed to bond the transistor structure (or periphery structure) 100B and the memory cell structure (or array structure) 100A. As shown in FIG. 5, the first side 160' of the periphery substrate 160 and the first side 102' of the base layer 102 are aligned facing each other so that the first bonding structures 150 and the second bonding structures 152 can be connected to each other through the bonding process. In some embodiments, the first bonding structures 150 and the second bonding structures 152 can include Cu, Ni, SnAg, or other suitable bonding materials.

Figure 6:
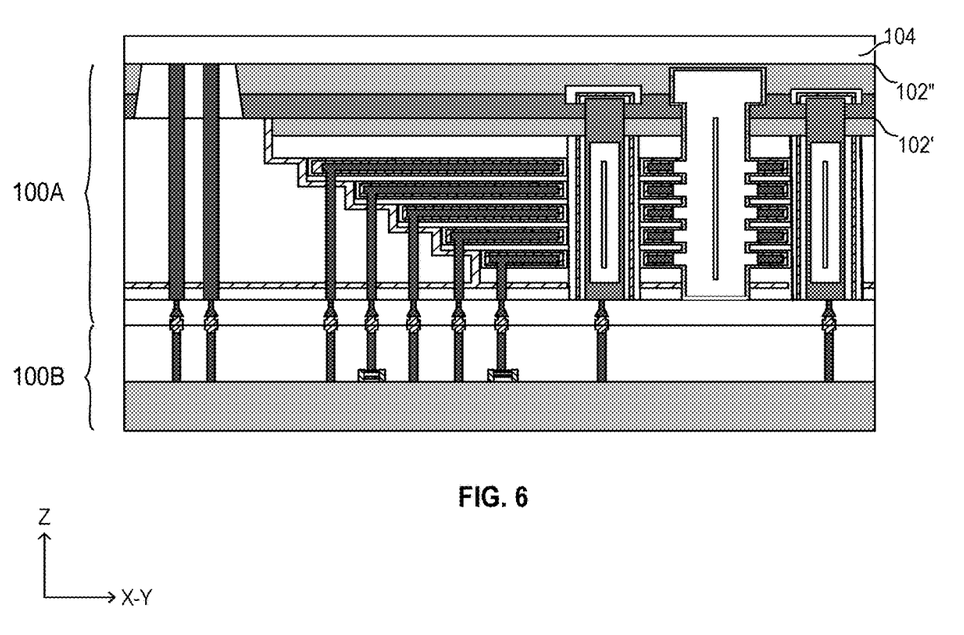

In FIG. 6, the dielectric stack 167 and the contact pad 174 can be removed from the second side 102" of the base layer 102. In order to remove the dielectric stack 167 and the contact pad 174, a removal process can be applied. The removal process can include a wet etching process, a dry etching process, a polishing process, or other suitable removal process. Subsequently, a first dielectric layer 104 can be formed over the second side 102" of the base layer 102. Any suitable deposition process can be applied to form the first dielectric layer 104, such as a chemical vapor deposition process, a physical vapor deposition process, a diffusion process, an atomic layer deposition process, or other suitable deposition processes.

Figure 7:
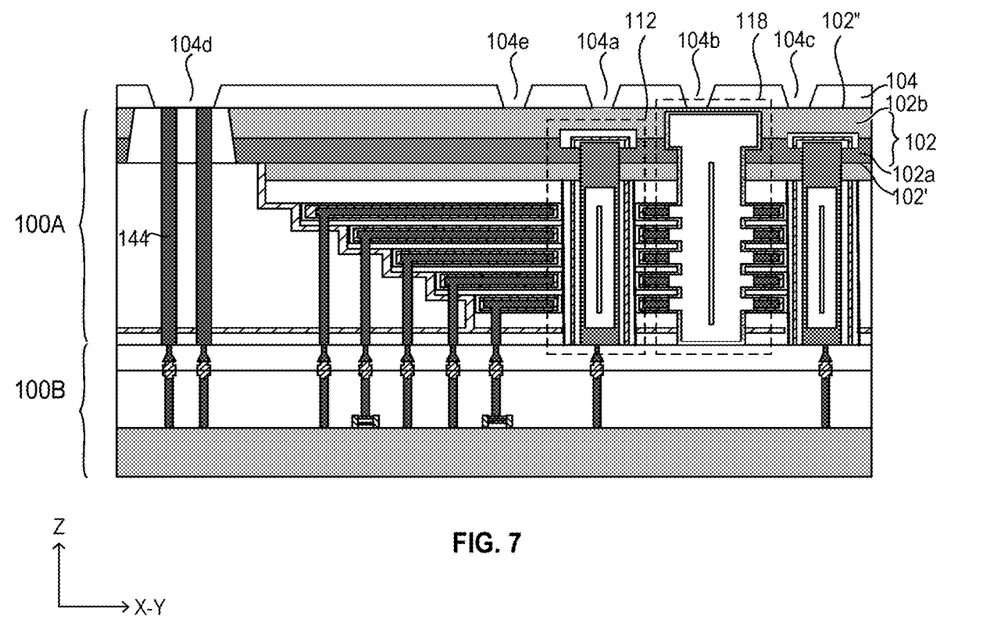

In FIG. 7, a plurality of contact openings 104a-104d can be formed in the first dielectric layer 104. In order to form the contact openings 104a-104d, a patterning process can be operated that can include a photolithographic process and an etching process. The photolithographic process can form a patterned mask (not shown) with patterns over the first dielectric layer 104, and the etching process can subsequently transfer the patterns into the first dielectric layer 104. When the etching process is completed, the patterned mask can be removed by a dry strip process. The contact openings 104a-104d can be subsequently formed when the patterned mask is removed. The contact openings 104a-104d can uncover the bonding pad contacts 144 and doped regions, such as N-wells, that are positioned in the second side 102" of the base layer 102.

In some embodiments, the doped regions can be formed based on an ion implantation process before the first dielectric layer 104 is deposited over the second side 102" of the base layer 102. In some embodiments, the doped regions can be formed during the formation of the base layer 102 that is illustrated in FIG. 2.

Figure 8:
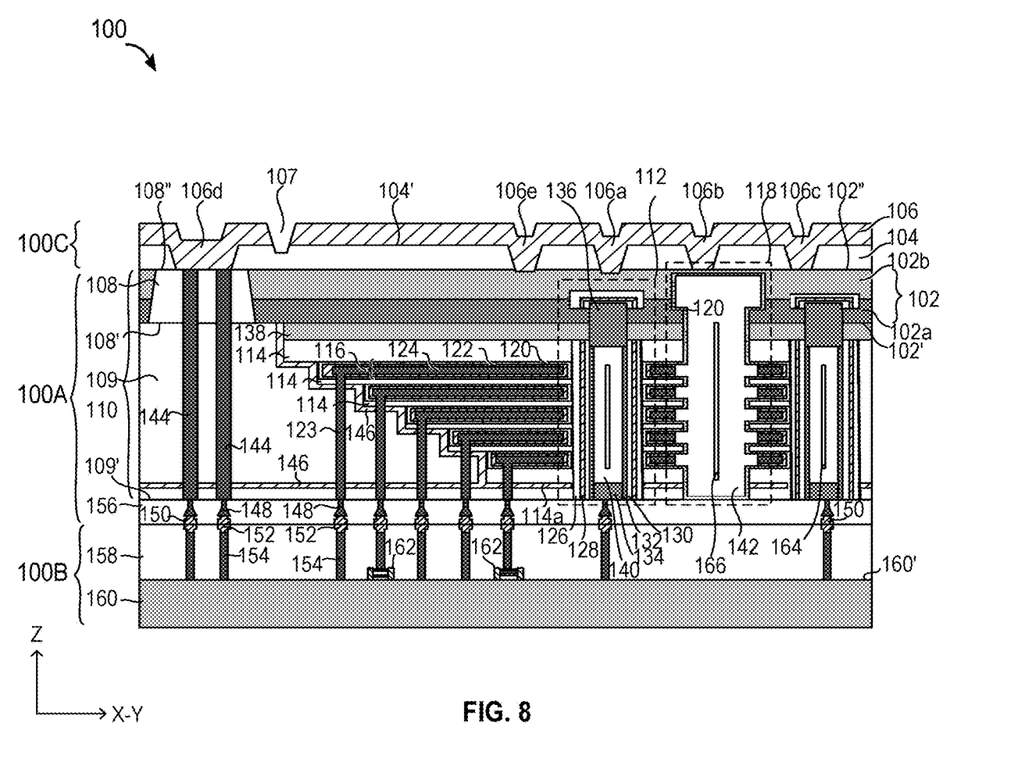

In FIG. 8, a conductive layer can be formed to fill the contact openings 104a-104d. The conductive layer can further be arranged over a bottom surface 104' of the first dielectric layer 104. In some embodiments, a subsequent etching process can be performed to form an isolation trench 107 that can separate the conduction layer into a first portion and second portion. The first portion can be arranged over the bonding pad contacts 144 and the second portion can be disposed over the base layer 102. When the formation of the conductive layer is completed, a plurality of connection structures 106 can be formed accordingly. The connection structures 106 can extend through the first dielectric layer 104 so as to connect to the bonding pad contacts 144 and the base layer 102. The connection structures 106 can be coupled to the channel structures 112 and the slit structure 118 through the doped regions that are positioned in the second side 102" of the base layer 102. For example, the connection structure 106a can be coupled to the channel structure 112, and the connection structure 106b can be coupled to the slit structure 118. The connection structures 106 can be made of aluminum, copper, tungsten, or other suitable conductive materials.

When the formation of the connection structures 106 is completed, a 3D-NAND device 100 is formed. The 3D-NAND device 100 can have similar features to the 3D-NAND device 100 that is illustrated in FIG. 1. For example, the 3D-NAND device 100 can have a memory cell structure (or array structure) 100A, a transistor structure (or periphery structure) 100B, and a connection structure (100C) that are coupled to each other. The memory cell structure 100A can include a memory cell stack 110 that is formed over the first side 102' of the base layer 102.

Figure 9:
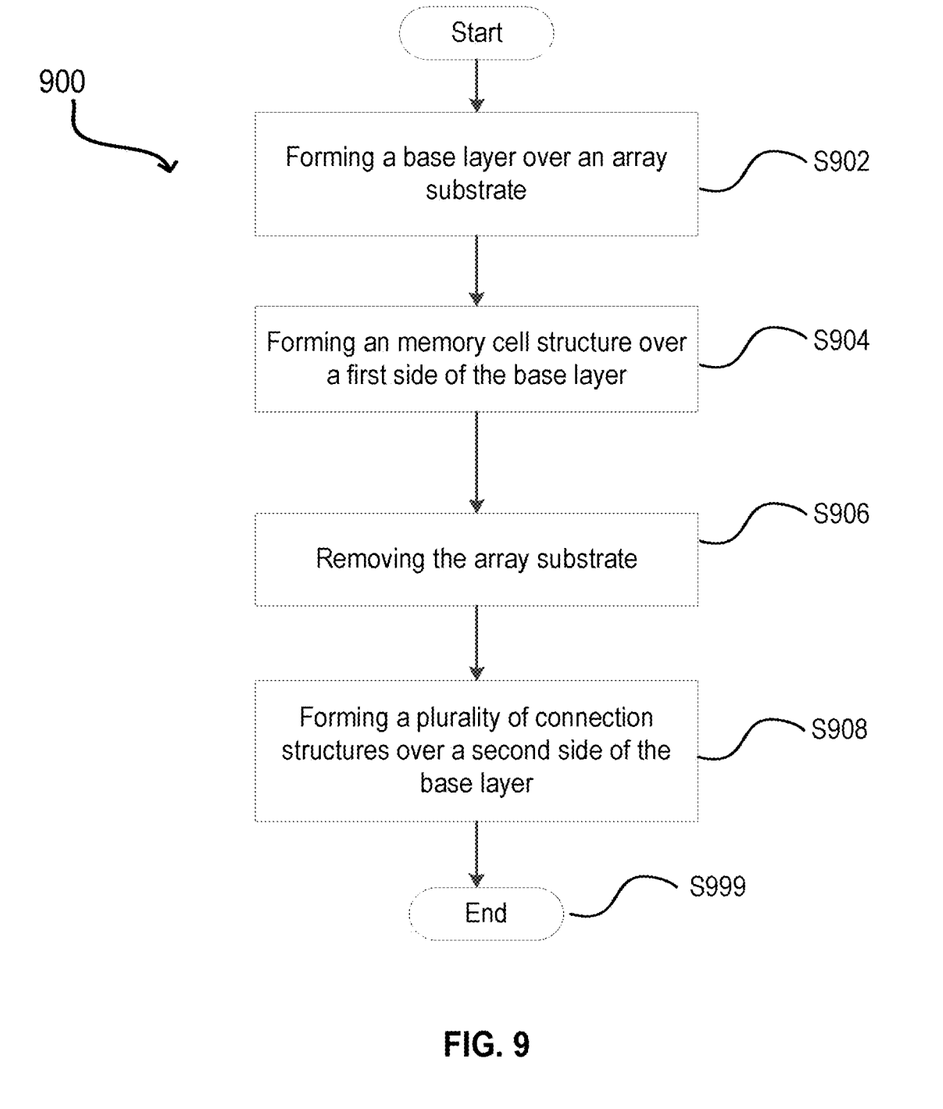
FIG. 9 is a flowchart of a process for manufacturing a 3D-NAND device, in accordance with exemplary embodiments of the disclosure.

FIG. 9 is a flowchart of a process 900 for manufacturing the disclosed 3D-NAND device in accordance with some embodiments of the present disclosure. The process 900 begins at step S902 where a base layer is formed over an array substrate. The base layer can have a first side and an opposing second side that is in contact with the array substrate. In some embodiments, a second dielectric layer can further be arranged in the base layer between the first side and the second side. In some embodiments, the steps S902 can be performed as illustrated with reference to FIG. 2.

At step S904, a memory cell structure can be formed over the first side of the base layer. The memory cell structure can include a stack of alternating word line layers and insulating layers that is positioned over the first side of the base layer, and a channel structure that extends through a first region of the stack in a vertical direction and further extends into the base layer from the first side. In some embodiments, a third dielectric layer can also be formed over a first surface of the second dielectric layer and the first side of the base layer, where the stack of alternating word line layers and insulating layers and the channel structure are arranged in the third dielectric layer. A plurality of bonding pad contacts can further be formed in the second dielectric layer and the third dielectric layer, and extend in the vertical direction between a second surface of the second dielectric layer and a top surface of the third dielectric layer. A plurality of word line contacts can be formed to extend from respective word line layers in a second region of the stack through the third dielectric layer in the vertical direction. A gate line slit structure can be formed to extend into the base layer, and further extend through the third dielectric layer in the vertical direction. In some embodiments, the steps S904 can be performed as illustrated with reference to FIG. 2.

The process 900 then proceeds to step S906, where the array substrate can be removed so that the second side of the base layer is uncovered. In some embodiments, a dielectric stack can further be formed over the second side of the base layer after the array substrate is removed, and a contact pad can be formed over the dielectric stack. In some embodiments, the steps S906 can be performed as illustrated with reference to FIGS. 3A and 3B.

At step S908, a plurality of connection structures can be formed over the second side of the base layer, where the connection structures can include a first connection structure that is coupled to the channel structure. In some embodiments, in order to form the connection structures, a transistor can be formed in a first side of a periphery substrate, where the periphery substrate has the first side and an opposing second side. A plurality of contact structures can be formed to extend from the first side of the periphery substrate in the vertical direction, where one of the contact structures is coupled to the transistor. Second bonding structures can be formed over the contact structures and coupled to the contact structures. The base layer and the periphery substrate can be bonded together, where the first side of the periphery substrate and the first side of the base layer are aligned facing each other so that the first bonding structures and the second bonding structures are connected to each other. Further, the dielectric stack and the bonding pad can be removed from the second side of the base layer so that the second side of the base layer is uncovered. A doped region can be formed in the second side of the base layer, where the dope region can be coupled to the channel structure. A first dielectric layer can be formed over the second side of the base layer, where the connection structures can extend through the first dielectric layer so that the first connection structure of the connection structures can be in direct contact with the doped region. In some embodiments, the steps S908 can be performed as illustrated with reference to FIGS. 4-8.

It should be noted that additional steps can be provided before, during, and after the process 900, and some of the steps described can be replaced, eliminated, or performed in different order for additional embodiments of the process 900. For example, various additional interconnect structures (e.g., metallization layers having conductive lines and/or vias) may be formed over the first and second contact structures of the 3D-NAND device. Such interconnect structures electrically connect the 3D-NAND device with other contact structures and/or active devices to form functional circuits. Additional device features such as passivation layers, input/output structures, and the like may also be formed.

The various embodiments described herein offer several advantages over related 3D-NAND memory devices. For example, in the related 3D-NAND memory devices, the memory cell stack can be formed in a cell array substrate, and parasitic capacitance can be produced between the TSVs and the cell array substrate. In the disclosure, the memory cell stack can be formed in a base layer, and TSVs can be eliminated. Thus, the parasitic capacitance produced between the TSVs and the cell array substrate can be eliminated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a base layer having a first side for forming memory cells and a second side that is opposite to the first side;
 a stack of alternating word line layers and insulating layers positioned over the first side of the base layer, the stack including a first region and a second region;
 a channel structure extending through the first region of the stack along a vertical direction and further extending into the base layer;
 a plurality of connection structures formed over the second side of the base layer and including a first connection structure that is coupled to the channel structure; and
 a plurality of bonding pad contacts that each extend in the vertical direction as a single element from a first dielectric layer formed over the second side of the base layer, through a second dielectric layer arranged in the base layer between the first side and the second side, a third dielectric layer formed over a first surface of the second dielectric layer and the first side of the base layer, and the base layer.

2. The semiconductor device of claim 1, further comprising:
 a doped region formed in the second side of the base layer and coupled to the channel structure,
 wherein the connection structures extend through the first dielectric layer so that the first connection structure of the connection structures is in direct contact with the doped region.

3. The semiconductor device of claim 2, wherein:
 the stack is arranged in the third dielectric layer, and
 the plurality of bonding pad contacts are formed in the second dielectric layer and the third dielectric layer, the bonding pad contacts extending in the vertical direction between a second surface of the second dielectric layer and a top surface of the third dielectric layer.

4. The semiconductor device of claim 3, wherein the connection structures further include a second connection structure that is coupled to the bonding pad contacts.

5. The semiconductor device of claim 4, wherein the second region of the stack has a stair-cased configuration and the semiconductor device further comprises:
a plurality of word line contacts that are formed in the third dielectric layer and positioned on respective word line layers in the second region.

6. The semiconductor device of claim 5, wherein the connection structures further include a third connection structure and the semiconductor device further comprises:
a gate line slit structure that extends through the third dielectric layer in the vertical direction and extends into the base layer, and further is coupled to the third connection structure of the connection structures.

7. The semiconductor device of claim 6, further comprising:
a source layer that is positioned between the base layer and the stack, and surrounds a bottom channel contact of the channel structure.

8. The semiconductor device of claim 7, further comprising:
a substrate having a first side and an opposing second side;
a transistor formed in the first side of the substrate; and
a plurality of contact structures extending from the first side of the substrate in the vertical direction, one of the contact structures being coupled to the transistor.

9. The semiconductor device of claim 8, further comprising:
first bonding structures formed over the top surface of the third dielectric layer and coupled to the bonding pad contacts, the word line contacts, and a top channel contact of the channel structure; and
second bonding structures formed over the contact structures and coupled to the contact structures,
wherein the first side of the substrate and the first side of the base layer are aligned facing each other so that the first bonding structures and the second bonding structures are connected to each other.

10. A semiconductor device, comprising:
a transistor formed in a first side of a substrate;
an memory cell structure formed over a first side of a base layer; and
a plurality of connection structures formed over an opposing second side of the base layer, wherein the memory cell structure includes:
a stack of alternating word line layers and insulating layers positioned over the first side of the base layer, the stack including a first region and a second region,
a channel structure extending through the first region of the stack in a vertical direction and further extending into the base layer,
a plurality of word line contacts extending from respective word line layers in the second region of the stack, the second region of the stack having a stair-cased configuration, and
a plurality of bonding pad contacts that extend in the vertical direction as a single element from a first dielectric layer formed over the second side of the base layer, through a second dielectric layer arranged in the base layer between the first side and the second side, a third dielectric layer formed over a first surface of the second dielectric layer and the first side of the base layer, and the base layer,
wherein:
the connection structures include a first connection structure that is coupled to the channel structure, and
the first side of the substrate and the first side of the base layer face each other so that the transistor and the channel structure are coupled to each other.

11. The semiconductor device of claim 10, further comprises:
a doped region formed in the second side of the base layer and coupled to the channel structure,
wherein the connection structures extend through the first dielectric layer so that the first connection structure of the connection structures is in direct contact with the doped region.

12. The semiconductor device of claim 11, wherein:
the stack is arranged in the third dielectric layer, and
the plurality of bonding pad contacts are formed in the second dielectric layer and the third dielectric layer, the bonding pad contacts extending in the vertical direction between a second surface of the second dielectric layer and a top surface of the third dielectric layer.

13. The semiconductor device of claim 12, further comprises:
a plurality of contact structures extending from the first side of the substrate in the vertical direction, wherein:
a first contact structure of the contact structures is coupled to the transistor and further coupled to one of the word line contacts, and
a second contact structure of the contact structures is coupled to one of the bonding pad contacts.

* * * * *